United States Patent
Hosaka et al.

(10) Patent No.: US 7,781,753 B2
(45) Date of Patent: Aug. 24, 2010

(54) MULTI-VALUE RECORDING PHASE-CHANGE MEMORY DEVICE, MULTI-VALUE RECORDING PHASE-CHANGE CHANNEL TRANSISTOR, AND MEMORY CELL ARRAY

(75) Inventors: Sumio Hosaka, Takasaki (JP); Hayato Sone, Kiryu (JP); Masaki Yoshimaru, Hachioji (JP); Takashi Ono, Hachioji (JP); Mayumi Nakasato, Gifu (JP)

(73) Assignee: Semiconductor Technology Academic Research Center, Kanagawa (JP)

( * ) Notice: Subject to any disclaimer, the term of this patent is extended or adjusted under 35 U.S.C. 154(b) by 13 days.

(21) Appl. No.: 11/905,748

(22) Filed: Oct. 3, 2007

(65) Prior Publication Data

US 2008/0105861 A1 May 8, 2008

(30) Foreign Application Priority Data

Oct. 3, 2006 (JP) ............................. 2006-271743

(51) Int. Cl.
*H01L 29/02* (2006.01)
(52) U.S. Cl. .................... 257/2; 257/3; 257/4; 257/5; 257/E29.002; 438/102; 438/103; 365/163
(58) Field of Classification Search ................ 257/1–5, 257/E29.002; 438/102–103; 365/163
See application file for complete search history.

(56) References Cited

U.S. PATENT DOCUMENTS

2004/0038480 A1* 2/2004 Moore et al. ................ 438/257
2004/0113135 A1 6/2004 Wicker
2006/0077706 A1* 4/2006 Li et al. ...................... 365/163
2007/0187801 A1* 8/2007 Asao et al. .................. 257/613
2007/0278538 A1* 12/2007 Chao ........................... 257/248

FOREIGN PATENT DOCUMENTS

| JP | 2001-189431 | 7/2001 |
|---|---|---|
| JP | 2005/031725 | 4/2005 |
| JP | 2005-93619 | 4/2005 |
| JP | 2006-108645 | 4/2006 |
| JP | 2006-155700 | 6/2006 |

OTHER PUBLICATIONS

Hajto et al, Journal of Thermal Analysis, vol. 9, (1976) pp. 53-58.*
Japanese Notice of Reasons for Rejection issued on Dec. 22, 2008 in corresponding Japanese Patent Application 2006-271743.

* cited by examiner

*Primary Examiner*—Bradley K Smith
*Assistant Examiner*—Jami M Valentine
(74) *Attorney, Agent, or Firm*—Staas & Halsey LLP

(57) ABSTRACT

A multi-value recording phase-change memory device that can stably record multi-value information, and that can reproduce information with high reliability, comprises a first electrode layer 26, a second electrode layer 28, and a memory layer 30 provided between the first and second electrode layers 26 and 28 and containing a phase-change material layer formed from a phase-change material which is stable in either an amorphous phase or a crystalline phase at room temperature, wherein the memory layer 30 includes a plurality of mutually isolated sub-memory layers 32, 34, 36, and 38 between the first and second electrode layers 26 and 28.

7 Claims, 9 Drawing Sheets

"0"

"1"

"2"

"3"

United States Patent US 7,781,753 B2

MULTI-VALUE RECORDING PHASE-CHANGE MEMORY DEVICE, MULTI-VALUE RECORDING PHASE-CHANGE CHANNEL TRANSISTOR, AND MEMORY CELL ARRAY

CROSS-REFERENCE TO RELATED APPLICATION

This application claims priority from Japanese Patent Application No. 2006-271743, filed on Oct. 3, 2006.

TECHNICAL FIELD OF THE INVENTION

The present invention relates to a multi-value recording phase-change memory device and a multi-value recording phase-change channel transistor, each using a phase-change material which is stable in either a crystalline phase or an amorphous phase at room temperature, and also relates to a memory cell array constructed from such devices or transistors.

BACKGROUND OF THE INVENTION

A chalcogenide-based material, for example, has the property of being stable in either a crystalline phase or an amorphous phase at room temperature, and its resistivity changes by two to four orders of magnitude between the two phases. A nonvolatile memory is realized by making use of this property. In other words, information is written by causing a thin film of such a material to stabilize in either the crystalline or the amorphous phase, and the information is read out by detecting, through the measurement of its resistance value, whether the thin film is in the crystalline phase or the amorphous phase.

When writing information, i.e., a 1 or 0, to such a memory, the thin film of the phase-change material must undergo a phase change from crystalline to amorphous or from amorphous to crystalline. Generally, a chalcogenide-based material solidifies into the amorphous phase when the material is heated to 630° C. or higher and then cooled quickly. On the other hand, when the material is heated to 200° C. or higher and then gradually cooled it stabilizes in the crystalline phase. The thin film of the phase-change material is heated by using Joule heat that is generated when a current is passed through the thin film. When the thin film of the phase-change material has made a phase change to the amorphous phase, the resistance value of the thin film is two to four orders of magnitude larger than the resistance value the thin film would exhibit in the crystalline phase. Accordingly, by applying a read voltage to the thin film of the phase-change material and detecting the amount of current that flows, it can be determined in which phase, the amorphous phase or the crystalline phase, the thin film remains stable, and the written information can thus be read out.

Recently, it has been found that, in this kind of phase-change thin film material, the amount of current can be controlled by applying a bias voltage perpendicularly to the current flow direction. Using this property, a phase-change channel transistor having a memory function as well as a switching function has been proposed (refer to Japanese Unexamined Patent Publication No. 2005-93619). In this phase-change channel transistor, the memory function is achieved by forming the channel portion from a phase-change material, and the information read/write timing can be controlled by switching the current flowing through the channel portion on and off by the gate voltage. When a RAM is constructed using such phase-change channel transistors, each select transistor and its associated memory part can be implemented in a single transistor, and an ultra high-density storage device can be achieved. In traditional DRAM, each memory cell comprises a select transistor and a memory element formed from a capacitor, and the memory cell area increases because of the need to fabricate the capacitor on the semiconductor substrate, which has been a factor impeding device miniaturization. There has therefore been a limit to the extent to which memory cell density can be increased.

Since there has been a limit to the miniaturization of the memory cell, a multi-value recording method has been proposed that writes multi-value information to each device to achieve a further increase in recording density (for example, refer to WO 2005/031725 and Japanese Unexamined Patent Publication No. 2006-155700). When writing and reading binary information to and from a phase-change memory device, a 0 or 1 is written by causing the entire memory layer, for example, to change phase to a crystalline phase or an amorphous phase, respectively, and the thus written 0 or 1 is read out by detecting the resistance value of the memory layer held in that state. To achieve a multi-value recording, the memory layer must be made to exhibit a resistance value intermediate between the value it exhibits when the entire memory layer is in the crystalline phase and the value it exhibits when it is in the amorphous phase, by controlling the grain size of the crystalline phase, the change in the ratio of its volume, and the change in the volume of the amorphous phase that occur when the memory layer undergoes a phase change.

FIG. 1 is a diagram explaining a prior art multi-value recording method for a phase-change memory. FIG. 1(a) shows a state in which a 0 is recorded by causing the entire area of memory layer 2 to change to the crystalline phase (c). FIG. 1(b) shows a state in which a 1 is written by causing, for example, one-quarter of the entire area of memory layer 2 to change to the amorphous ($\alpha$) phase. FIG. 1(c) shows a state in which a 2 is written by causing, for example, one-half of the entire area of memory layer 2 to change to the amorphous phase. Further, FIG. 1(d) shows a state in which a 3 is written by causing the entire area of memory layer 2 to change to the amorphous phase.

When memory layer 2 is partially amorphized in a step-like manner as shown in parts (a) to (d) of FIG. 1, its resistance value changes in a step-like manner between the low resistance value associated with the crystalline phase and the high resistance value associated with the amorphous phase, and thus written information ranging from a 0 to a 3 can be read out by reading the resistance value of the memory layer 2. Theoretically, further multi-valued information can be recorded by partially amorphizing the memory layer 2 in finer steps. It will be appreciated here that the intermediate values can also be written and read out if a 0 is written by setting the entire memory layer 2 in the amorphous phase and a 1 written by setting it in the crystalline phase.

To cause the memory layer 2 to change to each of the (a) to (d) states, the temperature of the memory layer 2 must be controlled by controlling the number of write pulses. For example, one write pulse is applied to the memory layer 2 in the crystalline state to amorphizing a portion of the memory layer to write a 1, two write pulses are applied to write a 2, and three write pulses are applied to write a 3.

FIG. 2 shows the structure of a phase-change memory device capable of multi-value recording such as described above. Part (a) of FIG. 2 is a plan view of the phase-change memory device 4, and part (b) is a cross-sectional view taken along line A-A in part (a). In parts (a) and (b) of FIG. 2, reference numeral 6 is a semiconductor substrate of Si or the like, 8 is an insulating film of $SiO_2$ or the like formed on the semiconductor substrate 6, and 10 and 12 are first and second electrode layers formed on the insulating film 8. A memory layer 2 formed from a phase-change material such as chalcogenide is deposited on the insulating film 8 exposed between the first and second electrode layers 10 and 12 by using, for example, a plasma CVD method or the like.

The prior art multi-value recording phase-change memory device achieves multi-value recording by utilizing the change in the volume ratio between the crystalline phase area and the amorphous phase area in the memory layer 2, as earlier described. However, since this volume ratio changes with the size of the memory layer, the number of phase changes, etc., the volume of the amorphized area varies appreciably even when the same write pulse is applied. Accordingly, if the margin for the resistance value is small when recording a 0, a 1, a 2, a 3, etc., multi-value recording becomes difficult to achieve.

SUMMARY OF THE INVENTION

The present invention has been devised to overcome the above shortcoming associated with the prior art multi-value recording method that uses a phase-change memory device, and an object of the present invention is to provide a novel device structure suitable for multi-value recording, thereby to provide a novel multi-value recording phase-change memory device and multi-value recording phase-change channel transistor having a large margin for the resistance value for multi-value recording and hence capable of achieving multi-value recording with high reliability, and a memory cell formed from such a device or transistor.

To solve the above problem, a multi-value recording phase-change memory device according to a first invention comprises: a first electrode layer; a second electrode layer; and a memory layer provided between the first and second electrode layers and containing a phase-change material layer formed from a phase-change material which is stable in either an amorphous phase or a crystalline phase at room temperature, wherein the memory layer includes a plurality of mutually isolated sub-memory layers between the first and second electrode layers.

In the multi-value recording phase-change memory device according to the first invention, the memory layer may further include, in addition to the phase-change material layer, a resistive layer formed on top of the phase-change material layer, and the resistance value of the resistive layer may be chosen to be smaller than the resistance value the phase-change material layer exhibits in the amorphous phase but be larger than the resistance value the phase-change material layer exhibits in the crystalline phase.

In the multi-value recording phase-change memory device according to the first invention, the plurality of sub-memory layers between the first and second electrode layers may be formed so as to have the same resistance value but have respectively different heat capacities.

In the multi-value recording phase-change memory device according to the first invention, the plurality of sub-memory layers between the first and second electrode layers may be formed so as to have respectively different resistance values and respectively different heat capacities.

To solve the above problem, a multi-value recording phase-change channel transistor according to a second invention comprises: a first electrode layer; a second electrode layer; a memory layer provided between the first and second electrode layers and containing a phase-change material layer formed from a phase-change material which is stable in either an amorphous phase or a crystalline phase at room temperature; and a third electrode layer provided for the memory layer with an insulating film interposed therebetween, wherein the memory layer is divided into a plurality of mutually isolated sub-memory layers between the first and second electrode layers.

In the multi-value recording phase-change channel transistor according to the second invention, each of the plurality of sub-memory layers may further include, in addition to the phase-change material layer, a resistive layer formed on top of the phase-change material layer, and the resistance value of the resistive layer may be chosen to be smaller than the resistance value the phase-change material layer exhibits in the amorphous phase but be larger than the resistance value the phase-change material layer exhibits in the crystalline phase.

In the multi-value recording phase-change channel transistor according to the second invention, the plurality of sub-memory layers between the first and second electrode layers may be formed so as have the same resistance value but have respectively different heat capacities.

In the multi-value recording phase-change channel transistor according to the second invention, the plurality of sub-memory layers between the first and second electrode layers may be formed so as to have respectively different resistance values and respectively different heat capacities.

In the multi-value recording phase-change channel transistor according to the second invention, either a first voltage which shuts off a current flowing through the memory layer when a voltage is applied between the first and second electrodes or a second voltage which does not shut off the current may be selectively applied to the third electrode in order to cause the multi-value recording phase-change channel transistor to function as a switching device.

To solve the above problem, a memory cell array according to a third invention is constructed by arranging on a single substrate a plurality of memory cells each of which comprises a single MOS transistor and a multi-value recording phase-change memory device formed in accordance with the first invention.

To solve the above problem, a memory cell array according to a fourth invention is constructed by arranging on a single substrate a plurality of phase-change recording channel transistors each of which is formed in accordance with the second embodiment.

In the multi-value phase-change memory device according to the first invention or the multi-value phase-change channel transistor according to the second invention, since the memory layer formed between the first and second electrodes is constructed from a plurality of mutually isolated sub-memory layers, multi-valued information can be written based on which sub-memory layer or layers are to be caused to change phase. In this case, the change in the resistance value that occurs when one particular sub-memory layer is caused to change phase is almost uniquely determined by the shape of that particular sub-memory layer, and is not affected by the number of phase changes, etc. Accordingly, each individual level of information in the multi-valued information can be written and read out in the form of one of a plurality of clearly distinguished resistance values. This allows a relatively large margin for the writing and reading of multi-valued information, and a highly reliable multi-value phase-change memory device can thus be provided.

Furthermore, by forming the memory layer in a multilayer structure consisting of a phase-change material layer and a resistive layer, and by setting the resistance value of the resistive layer larger than the resistance value the phase-change material layer exhibits in the crystalline phase, but smaller than the resistance value the phase-change material layer exhibits in the amorphous phase, the write voltage necessary to cause the phase-change material layer to change phase from amorphous to crystalline can be reduced.

Further, when the plurality of sub-memory layers between the first and second electrode layers are formed so as to have the same resistance value or respectively different resistance values and have respectively different heat capacities, the phase-change control of each individual memory layer becomes further easier.

Moreover, by constructing a memory cell array by arranging a plurality of such multi-value recording phase-change memory devices or phase-change channel transistors on a single substrate, a memory cell array capable of recording information at higher density can be provided. In particular, when the memory cell array is constructed from multi-value recording phase-change channel transistors, since each switching transistor and its associated memory part, which have had to be formed as separate elements in the prior art, can be implemented in a single transistor, the area each memory cell occupies on the substrate greatly decreases, and thus a memory cell array having a high recording density can be achieved.

DETAILED DESCRIPTION

Embodiment 1

Figure 3A:
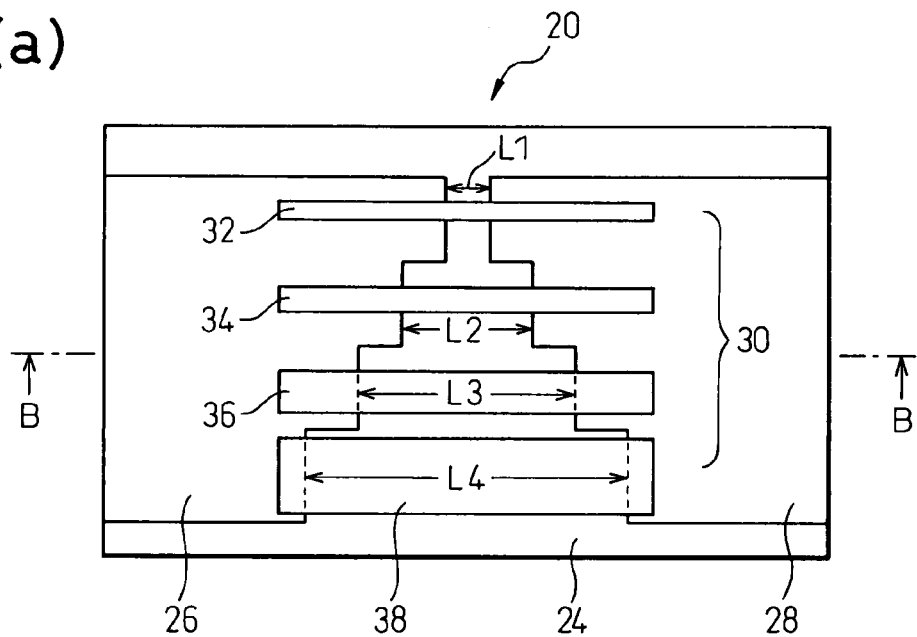
FIG. 3(a) is a plan view showing the structure of a multi-value recording phase-change memory device according to a first embodiment of the present
Figure 3B:
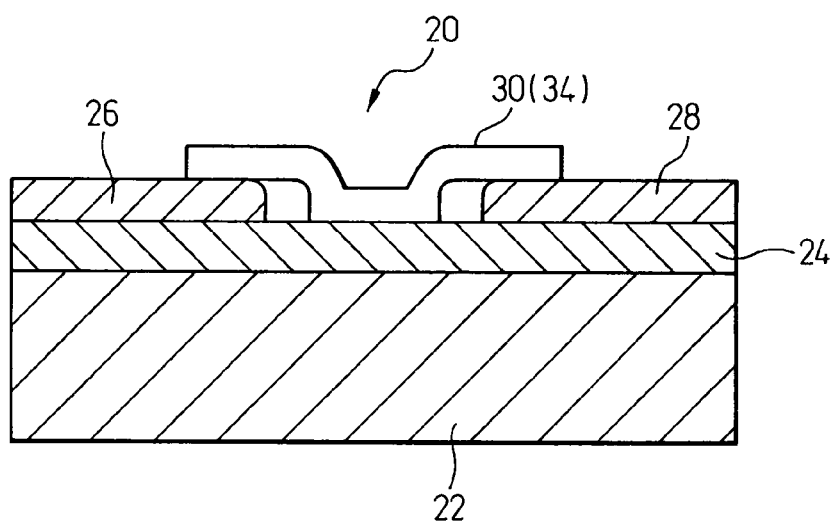
FIG. 3(b) is a cross-sectional view taken along line B-B in FIG. 3(a).

FIGS. 3(a) and 3(b) are diagrams showing the structure of a phase-change memory device 20 according to a first embodiment of the present invention: Part (a) shows a plan view of the structure and part (b) shows a cross-sectional view taken along line B-B in part (a). As shown, the multi-value recording phase-change memory device 20 according to this embodiment has a structure in which first and second electrode layers 26 and 28 are formed on an insulating film 24 of $SiO_2$ or the like deposited over a semiconductor substrate 22 of Si or the like, and a memory layer 30 of a phase-change material is formed between the electrodes. First and second electrode layers 26 and 28 are current heating electrodes for memory layer 30 and are formed from Al, Au, or like material. The opposing side faces of first and second electrode layers 26 and 28 are each formed in a staircase shape so that the distance L (L1, L2, L3, L4) between the electrodes changes in a step-like manner.

Memory layer 30 is formed from a material such as chalcogenide commonly used for a phase-change memory. In the present embodiment, memory layer 30 is constructed from a plurality of sub-memory layers 32, 34, 36, and 38 having mutually different volumes. Sub-memory layer 32 having a width W1 is formed on first and second electrode layers 26 and 28 in such a manner as to span the narrowest gap (distance L1) between them. Sub-memory layer 34 having a width W2 greater than that of sub-memory layer 32 is formed on first and second electrode layers 26 and 28 in such a manner as to span the second narrowest gap (distance L2) between them. Sub-memory layer 36 having a width W3 greater than W2 is formed on first and second electrode layers 26 and 28 in such a manner as to span the third narrowest gap (distance L3) between them. Sub-memory layer 38 having the greatest width W4 is formed on first and second electrode layers 26 and 28 in such a manner as to span the widest gap (distance L4) between them.

Sub-memory layers 32 to 38 can be formed, for example, by depositing a single memory layer on insulating film 24 on which electrode layers 26 and 28 have been formed, and thereafter dividing the layer into the respective regions by etching or the like. Alternatively, they can be formed by depositing the phase-change material through a mask pattern only on the regions where the respective sub-memory layers are to be formed. Sub-memory layers 32 to 38 formed by such a method have the same layer thickness t.

The resistance value R of a resistive body is expressed as $$R = \rho \times (L/S)$$

where ρ is the resistivity of the resistive body, L is the length of the resistive body, and S is the cross-sectional area of the resistive body. Denoting the thickness of the resistive body by t and the width of the resistive body by W, the cross-sectional area S is given as S=W·t. Therefore, R can be expressed as $R = \rho \times (L/W \cdot t)$ In memory layer 30 shown in FIG. 3, sub-memory layers 32 to 38 are formed from the same material and have the same layer thickness, as earlier described; therefore, their resistivity ρ is also the same. Accordingly, when the ratio between the length L and width W of the resistive portion is made the same for each of sub-memory layers 32 to 38, then sub-memory layers 32 to 38 have substantially the same resistance value R. On the other hand, when the lengths L1 to L4 of sub-memory layers 32 to 38 are set such that L1<L2<L3<L4, while setting their widths W1 to W4 such that W1<W2<W3<W4, then the heat capacities C1 to C4 of respective sub-memory layers 32 to 38 are defined by the relation C1<C2<C3<C4.

When voltage V is applied between first and second electrode layers 26 and 28, the current that flows through each of sub-memory layers 32 to 38 is the same in magnitude, but the degree of temperature rise due to the current is different for each of sub-memory layers 32 to 38. More specifically, the smaller the heat capacity of the sub-memory layer, the greater the temperature rise. Accordingly, there can occur a situation where, even when sub-memory layer 32 in a crystalline phase is heated up to the melting temperature of the material by the application of a certain amount of current and then rapidly cooled causing the material to transition from the crystalline phase to the amorphous phase, sub-memory layers 34 to 38 do not make a transition to the amorphous phase since the amount of current is not sufficient to heat them up to the melting temperature.

For a similar reason, there can occur a situation where, even when sub-memory layers 32 and 34 are caused to transition to the amorphous phase by the application of a different amount of current, sub-memory layers 36 and 38 do not make a transition to the amorphous phase but remain in the crystalline phase. Likewise, there can occur a situation where, even when sub-memory layers 32, 34, and 36 are caused to transition to the amorphous phase by the application of a different amount of current, sub-memory layer 38 does not make a transition to the amorphous phase but remains in the crystalline phase. Further, by applying a different amount of current, all of sub-memory layers 32 to 38 can be caused to transition to the amorphous phase.

Accordingly, multi-value information can be recorded in the following manner: that is, the case where all sub-memory layers 32 to 38 are in the crystalline state, each exhibiting a resistance value R, is taken to represent, for example, a 0, and the case where, by suitably controlling the current, only sub-memory layer 32 is caused to transition to the amorphous phase, the resistance value R being, for example, 1000R, is taken to represent a 1, while on the other hand, the case where sub-memory layers 32 and 34 are caused to transition to the amorphous phase, the resistance value R being 1000R, is taken to represent a 2, the case where sub-memory layers 32, 34, and 36 are caused to transition to the amorphous phase, the resistance value R being 1000R, is taken to represent a 3, and the case where all sub-memory layers 32 to 38 are caused to transition to the amorphous phase, the resistance value R being 1000R, is taken to represent a 4.

The information written as described above is read out in the following manner. When all sub-memory layers 32 to 38 are in the crystalline phase, each exhibiting a resistance value R, that is, when information representing a 0 is stored, the resistance value of the entire memory layer 30 is R/4. When sub-memory layer 32 makes a transition to the amorphous phase, and its resistance value becomes, for example, 1000R, that is, when information representing a 1 is stored, the resistance value of entire memory layer 30 is approximately equal to R/3. Likewise, when information representing a 2 is stored, the resistance value of memory layer 30 is approximately equal to R/2, and when information representing a 3 is stored, the resistance value is approximately equal to R; further, when information representing a 4 is stored, the resistance value is approximately equal to 25R. Accordingly, by calculating the resistance value by applying a voltage to memory layer 30 and reading the current that flows, the information written to memory layer 30 can be easily read out.

Figure 1A:
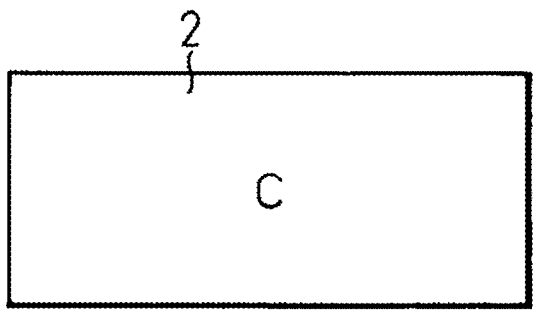
FIG. 1(a) is a diagram explaining how a 0 is recorded in a phase-change memory device according to a prior art multi-value recording method.
Figure 1B:
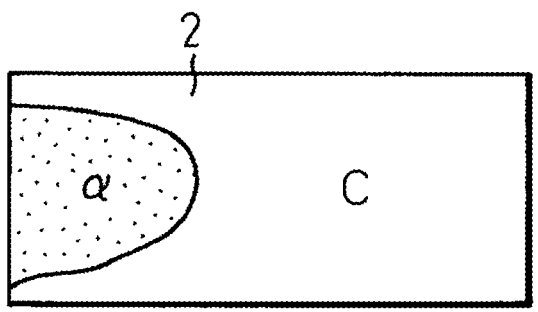
FIG. 1(b) is a diagram explaining how a 1 is recorded in the phase-change memory device according to the prior art multi-value recording method.
Figure 1C:
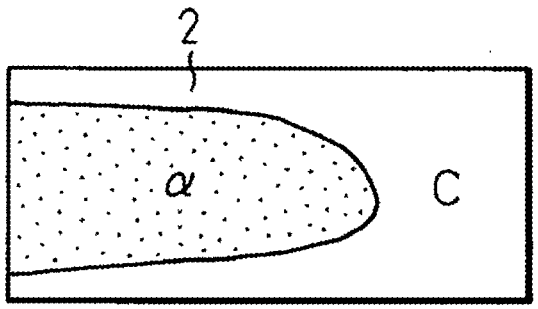
FIG. 1(c) is a diagram explaining how a 2 is recorded in the phase-change memory device according to the prior art multi-value recording method.
Figure 1D:
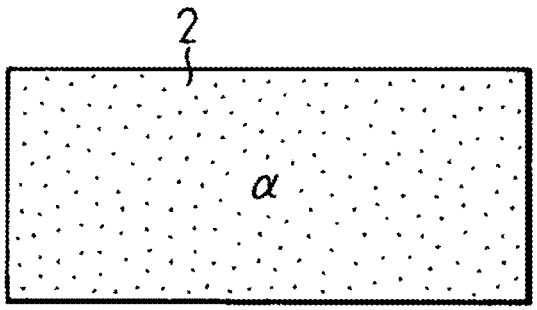
FIG. 1(d) is a diagram explaining how a 3 is recorded in the phase-change memory device according to the prior art multi-value recording method.
Figure 2A:
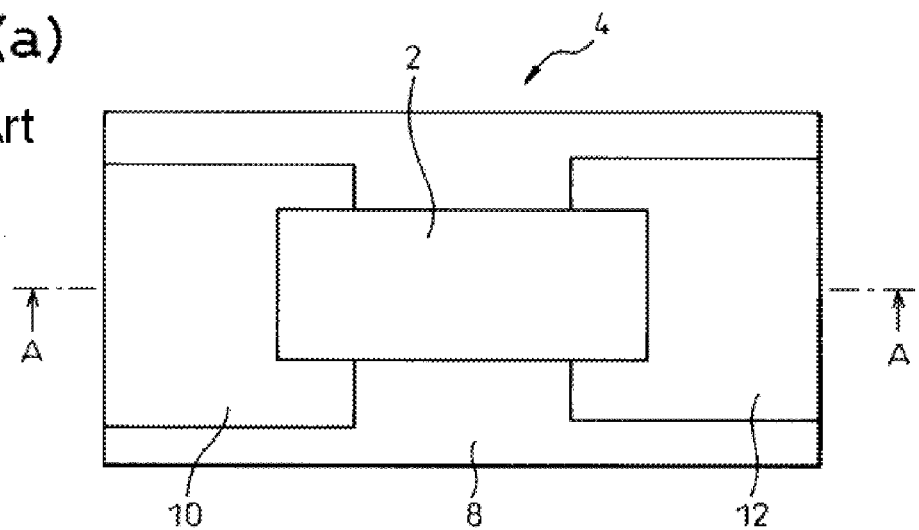
FIG. 2(a) is a plan view showing the structure of a prior art multi-value recording phase-change memory device.
Figure 2B:
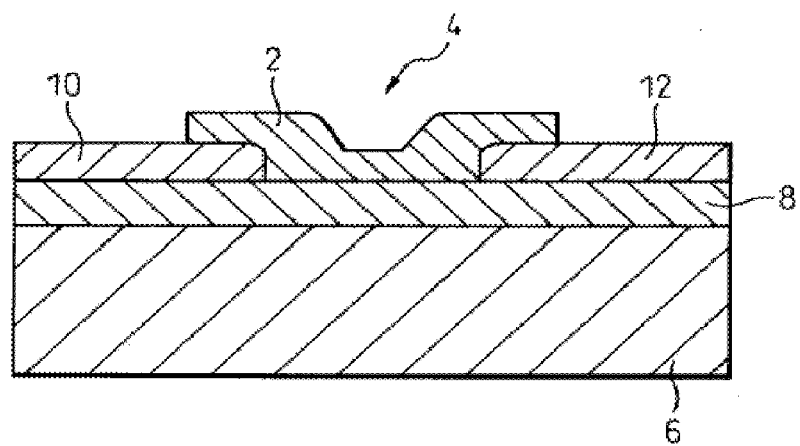
FIG. 2(b) is a cross-sectional view taken along line A-A in FIG. 2(a).

As described above, in the multi-value recording phase-change memory of the present invention, since memory layer 30 is constructed from sub-memory layers 32 to 38 having substantially the same resistance value but having different heat capacities, multi-value information can be written to memory layer 30 based on which sub-memory layer or layers are caused to transition from the crystalline phase to the amorphous phase. Accordingly, the resistance value when recording each bit of information does not vary widely, compared with the case where multi-value information is recorded by varying the volume of the amorphized area in a step-like manner in the single memory layer as shown in FIGS. 1 and 2. As a result, a multi-value recording device that can record and reproduce information with high reliability can be achieved.

Embodiment 2

Figure 4A:
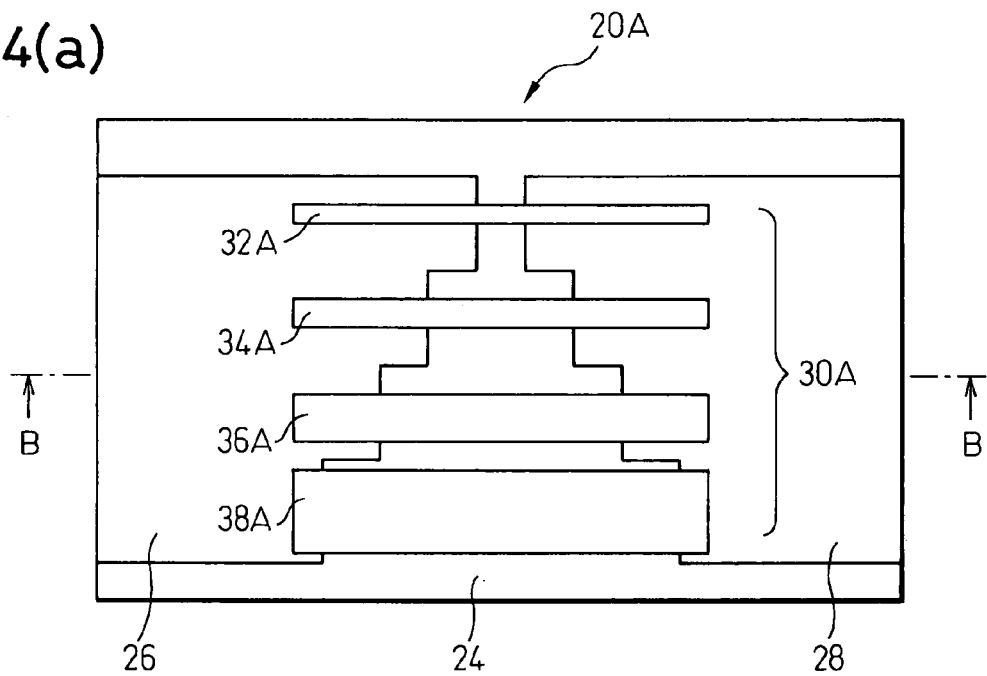
FIG. 4(a) is a plan view showing the structure of a multi-value recording phase-change memory device according to a second embodiment of the present invention.

FIG. 4 is a diagram showing the structure of a multi-value recording phase-change memory device 20A according to a second embodiment of the present invention: Part (a) of the figure shows a plan view of the structure and part (b) shows a cross-sectional view taken along line B-B in part (a). In the drawings given hereinafter, the same reference numerals as those in FIG. 3 designate identical or similar component elements to those described with reference to FIG. 3, and therefore, such component elements will not be further described herein.

Memory layer 30A of this embodiment comprises sub-memory layers 32A, 34A, 34A, and 38A. Each of sub-memory layers 32A, 34A, 34A, and 38A has a two-layer structure consisting of a phase-change material layer (34a) and a resistive layer (34b), as represented, for example, by sub-memory layer 34A in FIG. 4(b). In sub-memory layers 32A to 38A, since the phase-change material layers (indicated by 34a in the case of sub-memory layer 34) are formed from the same material and in the same shape as sub-memory layers 32 to 38 in the first embodiment shown in FIG. 3, the respective layers have the same resistance value and different heat capacities. It is therefore apparent that memory device 20A of the present embodiment is capable of recording and reproducing multi-value information based on the same principle as memory device 20 of the first embodiment shown in FIG. 3.

However, in the case of phase-change memory device 20 (see FIG. 3) in which multi-value information is recorded, when erasing the recorded information a phase change from the amorphous to the crystalline phase must be effected by flowing a current and thereby heating the sub-memory layer held in the amorphous state. When the phase-change material takes the amorphous phase, its resistance value is larger by a factor of $10^2$ to $10^4$ than when it takes the crystalline phase, and it becomes extremely difficult for a current to flow. Accordingly, when causing the phase-change material layer to change phase from the amorphous to the crystalline phase in order, for example, to erase the written information, the current necessary to effect the phase change must be generated by applying a considerably large voltage to the sub-memory layer. When the material layer changes from the amorphous phase to the crystalline phase due to the heating, since the resistance value is low in the crystalline phase, an excessive current can flow to the material due to the applied voltage, which can lead to the breakdown of the device.

Figure 4B:
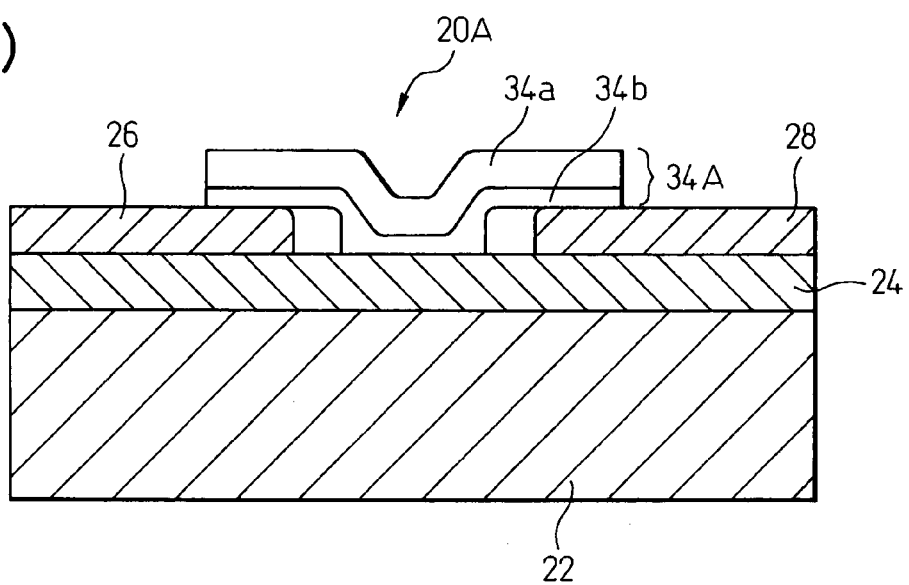
FIG. 4(b) is a cross-sectional view taken along line B-B in FIG. 4(a).

Phase-change memory device 20A shown in FIG. 4 provides the structure that overcomes the above shortcoming and, for this purpose, each of sub-memory layers 32A to 38A has a two-layer structure consisting of resistive layer (for example, 34b) and phase-change material layer (34a) as shown in FIG. 4(b). Here, the resistive layer (for example, 34b) has a resistance value that is smaller than the resistance value that the phase-change material layer (for example, 34a) exhibits when it is in the amorphous phase, but is larger than the resistance value that the phase-change material layer exhibits when it is in the crystalline phase. Such a resistive layer is formed, for example, from C, W, Mo, TiN, TiW, or the like.

In phase-change memory device 20A of the structure shown in FIG. 4, when the phase-change material layer (for example, 34a) in memory layer 30A takes the amorphous phase, if a voltage is applied between first and second electrode layers 26 and 28, the current flows primarily through the resistive layer (for example, 34b) because the resistance value in the amorphous phase is large. As a result, the resistive layer is heated by the application of a relatively low voltage and, with this heat, the phase-change material layer (for example, 34a) is heated indirectly and is thus caused to change phase. Once the phase-change material layer (for example, 34a) changes phase to the crystalline phase, since its resistance value becomes smaller than the resistance value of the resistive layer (for example, 34b) the current flows primarily through the phase-change material layer between first and second electrode layers 26 and 28.

As described above, in phase-change memory device 20A of the present embodiment, the applied voltage necessary to cause each sub-memory layer to transition from the amorphous phase to the crystalline phase can be reduced. In the example of FIG. 4, sub-memory layers 32A to 38A are each constructed by first forming the resistive layer (for example, 34b) on insulating film 24 and then forming the phase-change material layer (for example, 34a) on top of that, but it will be appreciated that a similar effect can be obtained if the phase-change material layer is formed on the insulating film 24 and the resistive layer is formed on top of that. In the latter case, an additional resistive layer may be formed on top of the phase-change material layer. Such modifications also fall within the scope of the present invention.

Embodiment 3

Figure 5A:
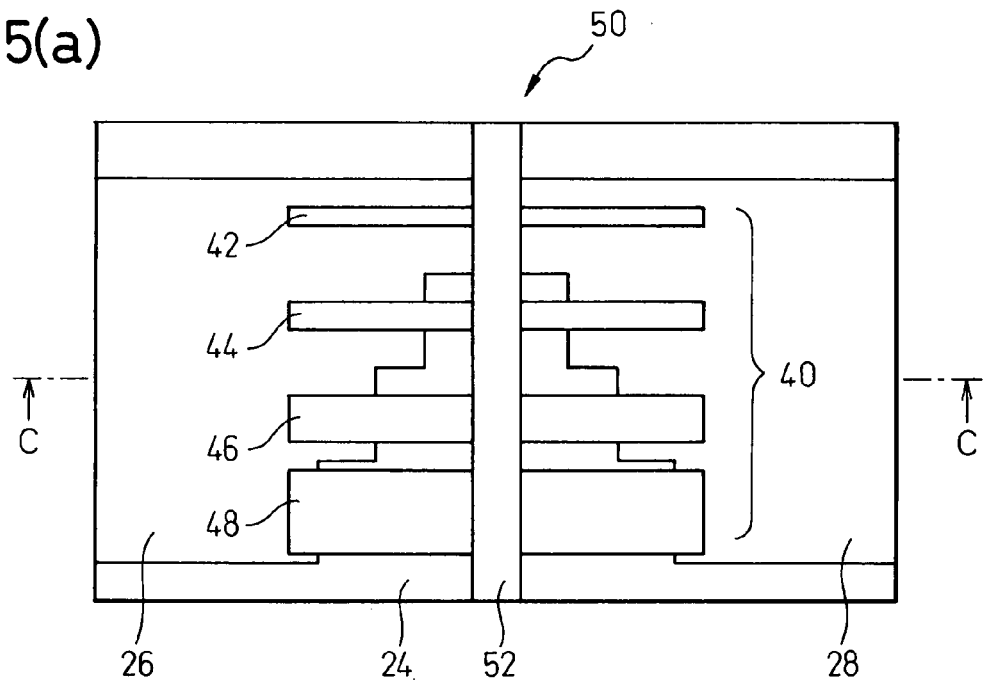
FIG. 5(a) is a plan view showing the structure of a multi-value recording phase-change channel transistor according to a third embodiment of the present invention.
Figure 5B:
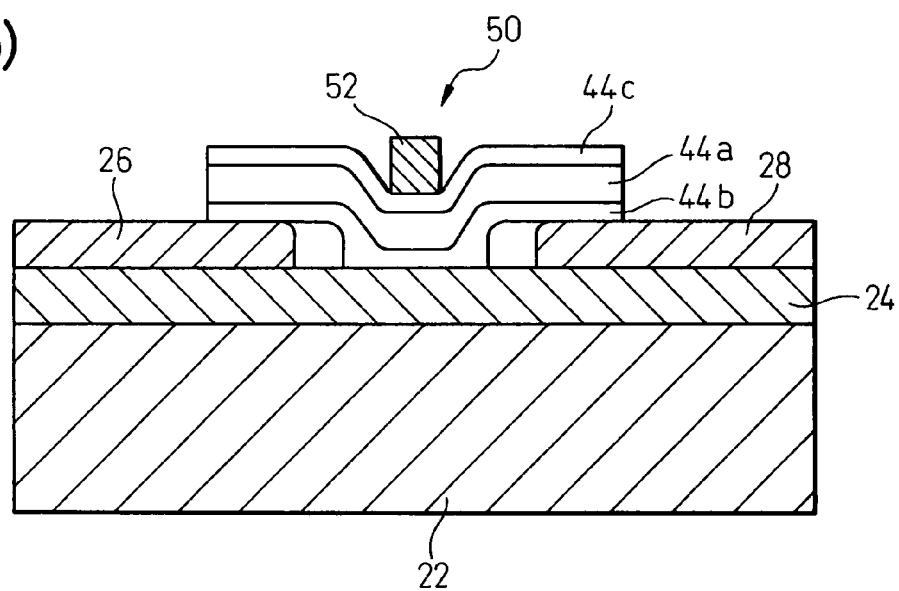
FIG. 5(b) is a cross-sectional view taken along line C-C in FIG. 5(a).

FIG. 5 is a diagram showing the structure of a multi-value recording phase-change channel transistor 50 according to a third embodiment of the present invention: Part (a) of the figure shows a plan view of the structure and part (b) shows a cross-sectional view taken along line C-C in part (a). In this transistor 50, memory layer 40 comprises sub-memory layers 42, 44, 46, and 48, which are formed from the same material and in the same shape as sub-memory layers 32A, 34A, 36A, and 38A shown in FIG. 4. However, transistor 50 of the present embodiment differs from the phase-change memory of FIG. 4 in that, in each of sub-memories 42, 44, 46, and 48, a gate electrode 52 is formed on top of the phase-change material layer (for example, 44a) by interposing an insulating layer (for example, 44c) therebetween. In FIG. 5(b), a multi-layer structure consisting of resistive layer 44b, phase-change material layer 44a, and insulating layer 44c is shown only for sub-memory layer 44, but it is apparent that other sub-memory layers 42, 46, and 48 each have a similar structure.

The phase-change channel transistor of the present embodiment is the same as the first and second embodiments in that memory layer 40 is constructed from sub-memory layers 42, 44, 46, and 48 having the same resistance value but having different heat capacities so that, by suitably selecting the amount of current to be flown between first and second electrode layers 26 and 28, only sub-memory layer 42 or sub-memory layers 42 and 44 or sub-memory layers 42, 44, and 46 or all sub-memory layers 42 to 48 can be caused to transition to the amorphous phase, thereby enabling multi-value information ranging from a 0 to a 4 to be recorded and read out. Furthermore, since each of sub-memory layers 42 to 48 has a two-layer structure consisting of resistive layer and phase-change material layer, the same effect as that achieved with phase-change memory device 20A of the second embodiment shown in FIG. 4 can also be achieved here. However, the present embodiment differs from device 20A of the second embodiment in that each of sub-memory layers 42 to 48 has a switching function which is implemented through control via the gate electrode 52.

The switching function of phase-change channel transistor 50 will be described below.

Figure 6:
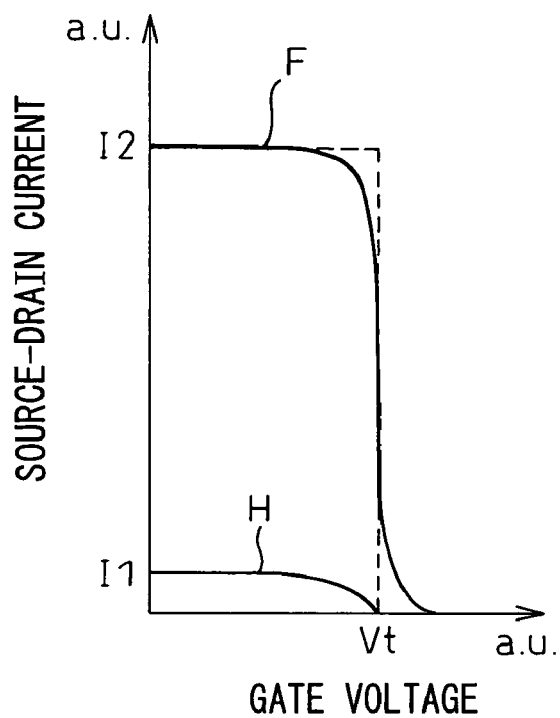
FIG. 6 is a diagram explaining the switching characteristic of the multi-value recording phase-change channel transistor shown in FIG. 5.

FIG. 6 schematically shows the relationship between the gate voltage and the source-drain current for phase-change channel transistor 50 shown in FIG. 5. The gate voltage is the voltage applied between gate electrode 52 and first (source) electrode layer 26 or second (drain) electrode layer 28. In FIG. 6, curve F represents the relationship between the gate voltage and the source-drain current (channel current) when the phase-change material layer is in the crystalline phase, and curve H shows the relationship between the gate voltage and the source-drain current when the phase-change material layer takes the amorphous phase.

As shown, in the channel formed from the phase-change material layer, when the gate voltage is lower than a predetermined value Vt, a substantially constant current I1 (in the case of the amorphous phase) or I2 (in the case of the crystalline phase), which is determined depending on whether the phase-change material layer is in the amorphous phase or crystalline phase, flows through the channel region irrespectively of the gate voltage, but when the gate voltage exceeds voltage Vt, very little channel current flows. Accordingly, by controlling the voltage applied to gate electrode 52, the device shown in FIG. 5 can be made to also function as a switching device.

This switching function of the phase-change material is described in detail in the previously cited Japanese Unexamined Patent Publication No. 2005-93619. In the example shown in FIG. 5, gate electrode layer 52 is formed in the uppermost portion of sub-memory layers 42 to 48, but instead, the gate electrode layer may be embedded in insulating film 24, and the resistive layer and the phase-change material layer may be formed in this order on top of that, or the gate electrode layer may be embedded in the insulating film, and the phase-change material layer and the resistive layer may be formed in this order on top of that. Such modifications also fall within the scope of the present invention.

In multi-value recording phase-change channel transistor 50 shown in FIG. 5, memory layer 40 has been shown as having a multilayer structure consisting of phase-change material layer and resistive layer, but it will be appreciated that if memory layer 40 is constructed only from phase-change material layer, such a multi-value recording phase-change channel transistor also falls within the scope of the present invention. In this case, the gate electrode should be formed on top of the phase-change material layer by interposing an insulating film therebetween.

Embodiment 4

Figure 7:
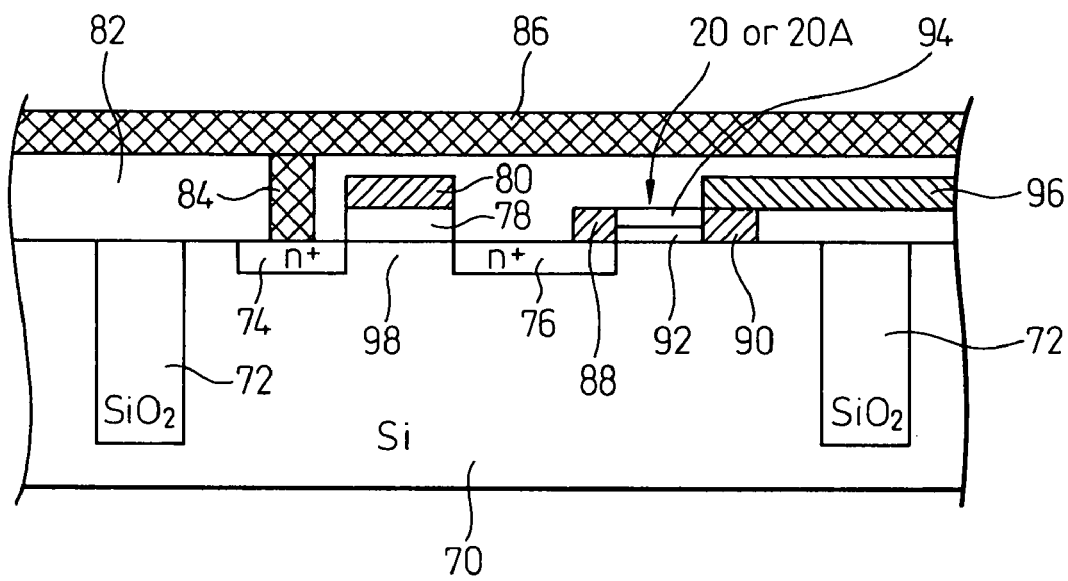
FIG. 7 is a cross-sectional view of a memory cell array according to a fourth embodiment of the present invention.

FIG. 7 is a partial cutaway cross-sectional view showing the structure of a memory cell array using multi-value recording phase-change memory device 20 or 20A according to the earlier described first or second embodiment. For ease of explanation, only one memory cell is shown in FIG. 7, but actually a plurality of such memory cells are formed on the same substrate.

In the figure, reference numeral 70 is an Si semiconductor substrate, 72 is an SiO$_2$ layer for device isolation, 74 and 76 are, for example, n+ diffusion layers, 78 is a gate insulating film, and 80 is a gate electrode. n+ diffusion layer 74 is connected to a bit line 86 via a plated hole 84 formed through an interlayer insulating film 82. Multi-value recording phase-change memory device 20 or 20A according to the earlier described first or second embodiment is formed on semiconductor substrate 70. Memory device 20 or 20A includes first and second electrode layers 88 and 90, an insulating film layer 92, and a memory layer 94. First electrode layer 88 is connected to n+ diffusion layer 76, while second electrode layer 90 is connected to a source line 96.

Diffusion layers 74 and 76 and gate electrode 80 together form a MOS transistor, and electrical current conduction through a channel region 98 formed in Si semiconductor substrate 70 directly below the gate is controlled on and off by the voltage applied to gate electrode 80. More specifically, when selecting memory device 20 (20A), channel region 98 is placed in a conducting state by controlling the voltage to gate electrode 80, thus supplying power to the memory part. On the other hand, when deselecting this memory part, an OFF voltage is applied to gate electrode 80. Accordingly, when channel region 98 is made to conduct by controlling the gate voltage of the MOS transistor, a multi-value write voltage (a voltage for causing a phase change) or read voltage is applied to memory part 20 (20A) via bit line 86, and conversely, when channel region 98 is placed in a nonconducting state, the write or read voltage is not applied. Gate electrode 80 is connected to a word line not shown.

In the memory cell array of the present embodiment described above, since the multi-value recording phase-change memory device shown in the first or second embodiment is used in each memory cell, multi-value recording can be accomplished in a stable and reliable manner, and thus, a memory cell array capable of recording and reproducing information at high density in a stable manner can be provided.

Embodiment 5

Figure 8:
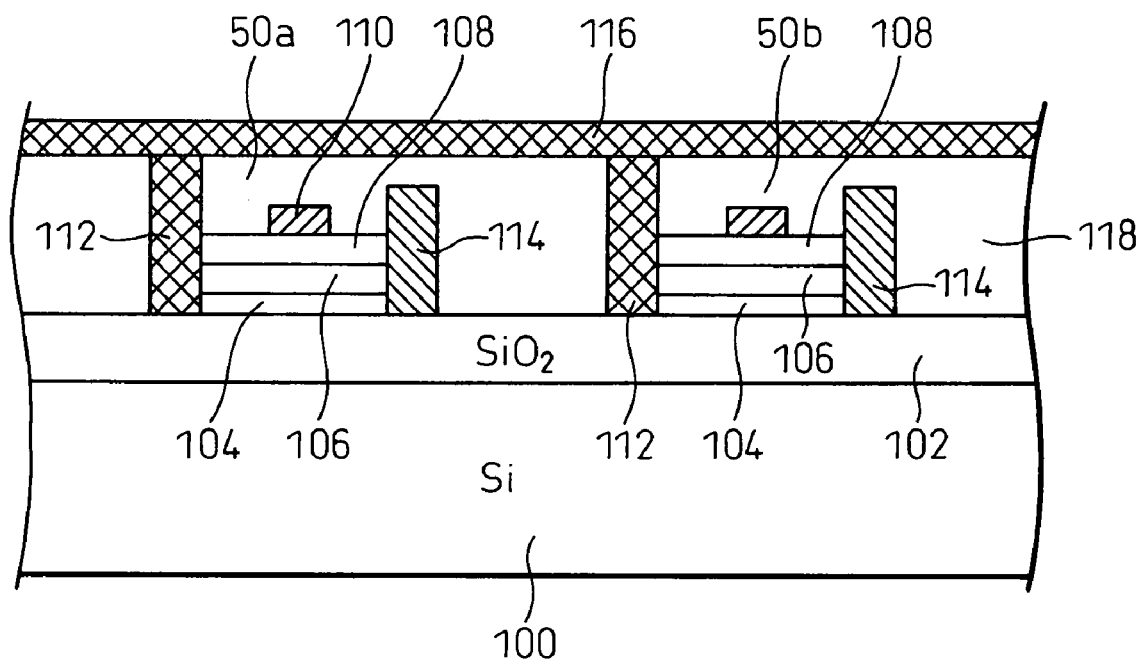
FIG. 8 is a cross-sectional view of a memory cell array according to a fifth embodiment of the present invention.

FIG. 8 is a cross-sectional view showing the structure of a memory cell array according to a fifth embodiment of the present invention. The memory cell array of this embodiment is constructed using multi-value recording phase-change channel transistor 50 of the third embodiment. In the figure, only two memory cells 50a and 50b are shown, but actually a large number of memory cells are formed on the same substrate to achieve a high recording density. In FIG. 8, reference numeral 100 indicates an Si semiconductor substrate, and 102 an insulating film of SiO$_2$ or the like, and multi-value recording phase-change channel transistors 50a and 50b, each identical to the one shown in FIG. 5, are formed on insulating film 102. Multi-value recording phase-change channel transistors 50a and 50b each comprise a resistive layer 104 formed from an insulating material, a phase-change material layer 106 formed from a phase-change material, a gate insulating film 108, a gate electrode 110, and first and second electrodes 112 and 114 forming a source electrode and a drain electrode, respectively.

Gate electrode 110 is connected to a word line not shown, first electrode 112 is connected to a bit line 116, and second electrode 114 is connected to a source line not shown. Reference numeral 118 indicates an interlayer insulating film. Resistive layer 104 and phase-change material layer 106 together form a memory part which stores information based on whether phase-change material layer 106 is in the amorphous phase or the crystalline phase. This memory part has the structure shown in the earlier described third embodiment, and is therefore capable of multi-value recording. A switching voltage for switching transistor 50a or 50b on and off is applied to gate electrode 110 via word line. A voltage for reading or writing to the memory part is applied between bit line 116 and the source line. Accordingly, by selecting and driving the bit line and the word line, the desired transistor in the memory array is selected and the writing, reading, or erasure of information is performed.

In the memory cell array shown in FIG. 8, since the transistor forming the memory part has the switching function, as earlier described with reference to the third embodiment, there is no need to provide a select transistor for addressing the desired memory cell. As a result, compared with a conventional memory cell array that requires the provision of the select transistor in addition to the memory part, the area of each memory cell can be greatly reduced, so that memory cells can be fabricated at a much higher density on the same substrate. Furthermore, since each memory cell is capable of recording multi-value information, the recording density of the memory can be further increased. It will also be recognized that, in each of memory cells 50a and 50b in FIG. 8, the phase-change channel transistor may be constructed by omitting resistive layer 104.

Other embodiments

Figure 9A:
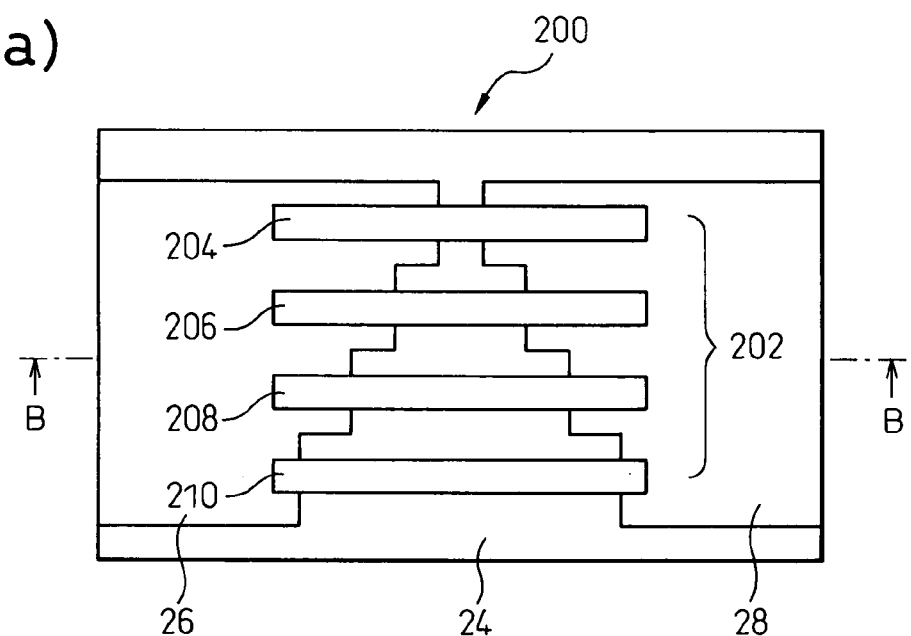
FIG. 9(a) is a plan view showing the structure of a multi-value recording phase-change memory device according to another embodiment of the present invention.
Figure 9B:
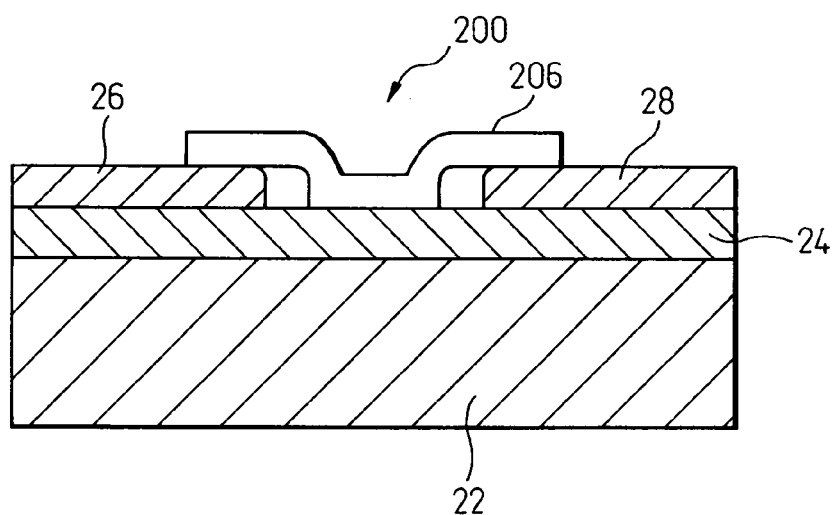
FIG. 9(b) is a cross-sectional view taken along line B-B in FIG. 9(a).
Figure 10A:
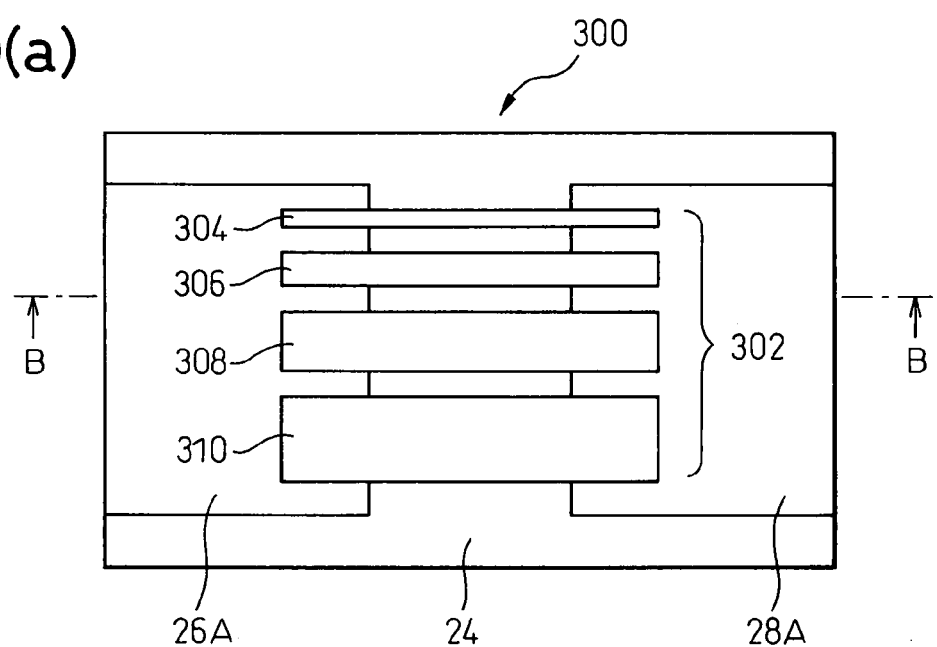
FIG. 10(a) is a plan view showing the structure of a multi-value recording phase-change memory device according to still another embodiment of the present invention.
Figure 10B:
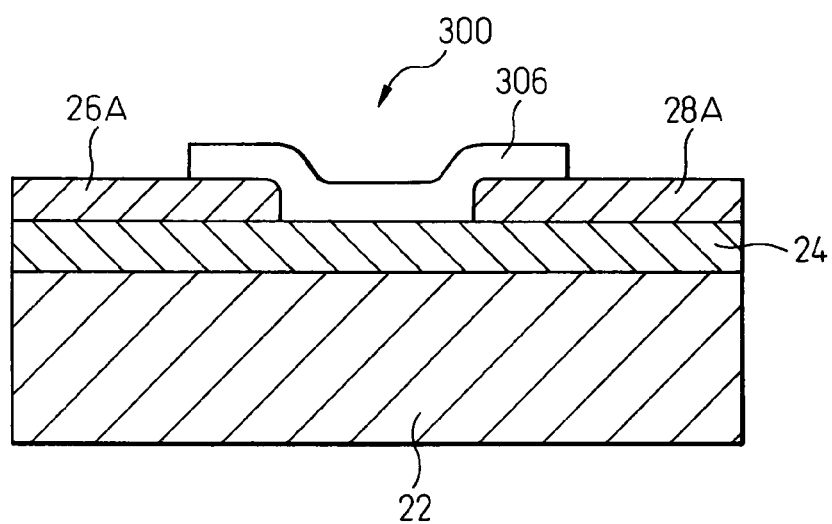
FIG. 10(b) is a cross-sectional view taken along line B-B in FIG. 10(a).

FIGS. 9 and 10 show other embodiments of the multi-value recording phase-change memory device shown in FIG. 3: Part (a) of each figure shows a plan view and part (b) shows a cross-sectional view taken along line B-B in part (a).

In multi-value recording phase-change memory device 200 shown in parts (a) and (b) of FIG. 9, a memory layer 202 formed from a phase-change material is deposited between first and second electrode layers 26 and 28 whose electrode spacing varies in a step-like manner as in the first embodiment, but in the present embodiment, sub-memory layers 204, 206, 208, and 210 are all formed in the same shape. As a result, the resistance values R of respective sub-memory layers 204 to 210 vary in proportion to the distance L between the electrodes. The heat capacities of the respective sub-memory layers also vary in proportion to the distance L.

In this multi-value recording phase-change memory device 200 also, by suitably adjusting the voltage, and the duration of application of the voltage, to be applied between first and second electrode layers 26 and 28, only sub-memory layer 204 or sub-memory layers 204 and 206 or sub-memory layers 204, 206, and 208 or all sub-memory layers 204 to 210 can be caused to transition, for example, from the crystalline to the amorphous phase, thereby enabling multi-value information ranging from a 0 to a 4 to be recorded with a large margin, as in the first embodiment.

In multi-value recording phase-change memory device 300 shown in FIG. 10, a memory layer 300 formed from a phase-change material is formed between first and second electrode layers 26A and 28B whose electrode spacing is constant along the entire width thereof. Memory layer 302 includes sub-memory layers 304, 306, 308, and 310 whose widths differ from one to another in a step-like manner, as in the first embodiment. In the present embodiment, since the spacing between first and second electrode layers 26A and 28A is constant, unlike the first embodiment, the resistance values of respective sub-memory layers 304 to 310 differ from one to another according to their shapes, and the heat capacities of the respective sub-memory layers also differ.

In this multi-value recording phase-change memory device 300 also, by suitably adjusting the voltage, and the duration of application of the voltage, to be applied between first and second electrode layers 26A and 28A, only sub-memory layer 304 or sub-memory layers 304 and 306 or sub-memory layers 304, 306, and 308 or all sub-memory layers 304 to 310 can be caused to transition, for example, from the crystalline to the amorphous phase, thereby enabling multi-value information ranging from a 0 to a 4 to be recorded with a large margin, as in the first embodiment.

In any of the above embodiments, for the phase-change material, use can be made not only of GeSbTe but also of such materials as GaSb, InSb, InSe, SbTe, GeTe, InSbTe, GaSeTe, SnSbTe, InSbGe, AgInSbTe, GeSnSbTe, GeSbSeTe, and TeGeSbS. In each of such materials, the composition ratio can be changed variously. Examples of the resistive layer material include C, W, Mo, TiN, TiW, etc. For the insulating film material, use can be made of $SiO_2$, $Si_3N_4$, etc. Further, in each of the above embodiments, the memory layer has been described as being divided into four sub-memory layers, but it will be appreciated that multi-value recording is possible as long as the memory layer is divided into two or more layers. Accordingly, the present invention is not limited to the embodiments described herein.

What is claimed is:

1. A multi-value recording phase-change memory device comprising:
    a first electrode layer and a second electrode layer, both formed spaced apart from each other on an insulating layer formed on a substrate; and
    a memory layer formed between said first and second electrode layers on said insulating layer and containing a phase-change material layer formed from a phase-change material which is stable in either an amorphous phase or a crystalline phase at room temperature, wherein
    said memory layer includes a plurality of mutually isolated sub-memory layers between said first and second electrode layers on said insulating layer, each of said sub-memory layers having a same thickness on said insulating layer and made of the same phase-change material; and
    at least one of a width of each of said plurality of sub-memory layers or a length of each of said plurality of sub-memory layers between said first and second electrodes differs from each other among said plurality of sub-memory layers.

2. A multi-value recording phase-change memory device as claimed in claim 1, wherein said memory layer further includes, in addition to said phase-change material layer, a resistive layer formed on top of said phase-change material layer, and wherein the resistance value of said resistive layer is smaller than the resistance value said phase-change material layer exhibits in said amorphous phase but is larger than the resistance value said phase-change material layer exhibits in said crystalline phase.

3. A multi-value recording phase-change memory device as claimed in claim 1, wherein said plurality of sub-memory layers between said first and second electrode layers have the same resistance value but have respectively different thermal capacitances.

4. A multi-value recording phase-change memory device as claimed in claim 2, wherein said plurality of sub-memory layers between said first and second electrode layers have the same resistance value but have respectively different thermal capacitances.

5. A multi-value recording phase-change memory device as claimed in claim 1, wherein said plurality of sub-memory layers between said first and second electrode layers have respectively different resistance values and respectively different thermal capacitances.

6. A multi-value recording phase-change memory device as claimed in claim 2, wherein said plurality of sub-memory layers between said first and second electrode layers have respectively different resistance values and respectively different thermal capacitances.

7. A memory cell array constructed by arranging a plurality of memory cells on a single substrate, each of said memory cells comprising:
    a single MOS transistor; and
    a multi-value recording phase-change memory device which includes a first electrode layer and a second electrode layer, both formed spaced apart from each other on an insulating layer formed on a substrate; and
    a memory layer formed between said first and second electrode layers on said insulating layer and containing a phase-change material layer formed from a phase-change material which is stable in either an amorphous phase or a crystalline phase at room temperature, wherein
    said memory layer includes a plurality of mutually isolated sub-memory layers between said first and second electrode layers on said insulating layer, each of said sub-memory layers having a same thickness on said insulating layer and made of the same phase-change material; and
    at least one of a width of each of said plurality of sub-memory layers or a length of each of said plurality of sub-memory layers between said first and second electrodes differs from each other among said plurality of sub-memory layers.

* * * * *